(12) United States Patent
Dijaili et al.

(10) Patent No.: US 6,347,106 B1
(45) Date of Patent: Feb. 12, 2002

(54) THERMALLY ROBUST SEMICONDUCTOR OPTICAL AMPLIFIERS AND LASER DIODES

(75) Inventors: Sol P. Dijaili, Moraga; Frank G. Patterson, Danville; Jeffrey D. Walker, El Cerrito; Robert J. Deri, Pleasanton; Holly Petersen, Manteca; William Goward, Antioch, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/257,288

(22) Filed: Feb. 25, 1999

(51) Int. Cl.[7] ............................................... H01S 5/223
(52) U.S. Cl. ...................................................... 372/46
(58) Field of Search ..................................... 372/45, 46

(56) References Cited

U.S. PATENT DOCUMENTS 5,974,068 A * 10/1999 Hideto et al. .................. 372/46

* cited by examiner

Primary Examiner—James W. Davie
(74) Attorney, Agent, or Firm—John P. Wooldridge; Alan H. Thompson

(57) ABSTRACT

A highly heat conductive layer is combined with or placed in the vicinity of the optical waveguide region of active semiconductor components. The thermally conductive layer enhances the conduction of heat away from the active region, which is where the heat is generated in active semiconductor components. This layer is placed so close to the optical region that it must also function as a waveguide and causes the active region to be nearly the same temperature as the ambient or heat sink. However, the semiconductor material itself should be as temperature insensitive as possible and therefore the invention combines a highly thermally conductive dielectric layer with improved semiconductor materials to achieve an overall package that offers improved thermal performance. The highly thermally conductive layer serves two basic functions. First, it provides a lower index material than the semiconductor device so that certain kinds of optical waveguides may be formed, e.g., a ridge waveguide. The second and most important function, as it relates to this invention, is that it provides a significantly higher thermal conductivity than the semiconductor material, which is the principal material in the fabrication of various optoelectronic devices.

44 Claims, 2 Drawing Sheets

THERMALLY ROBUST SEMICONDUCTOR OPTICAL AMPLIFIERS AND LASER DIODES

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to improvements in optoelectronic devices, such as laser diodes, light emitting diodes, semiconductor optical amplifiers, vertical cavity laser diodes, etc., and more specifically, the invention uses a highly thermally conductive (HTC) dielectric in optoelectronic devices.

2. Description of Related Art

Heat generation in any electronic semiconductor device is almost always deleterious to the device performance. The reason for this is basically the heat tends to "smear" or broaden the electron energy distribution and increase the decay rate of free carriers that contribute to the gain. The net effect in optoelectronic devices is that the optical gain decreases significantly with temperature. In devices such as laser diodes, light emitting diodes and optical amplifiers, these thermal effects can be catastrophic. The most common way to solve the problem is to conduct the heat away to a heat sink that is approximately at the ambient temperature.

SUMMARY OF THE INVENTION

It is an object of the present invention to provide a highly thermally conductive layer for use in an optoelectronic device.

The present invention uses a highly heat conductive layer in combination with or in the vicinity of optical waveguides in active semiconductor components. The thermally conductive layer enhances the conduction of heat away from the active region, which is where the heat is generated in active semiconductor components. In the invention, this layer is placed so close to the optical region that it may also function as a waveguide. This layer then can cause the active region to be nearly the same temperature as the ambient or heat sink. However, the semiconductor material itself should be as temperature insensitive as possible and therefore the invention combines a highly thermally conductive dielectric layer with improved semiconductor materials to achieve an overall package that offers improved thermal performance. The semiconductor materials include InGaAs strained quantum wells on GaAs substrates and AlGaInAs/InGaAs quantum wells on InP substrates. Advances in the types of semiconductor materials and the dielectric materials may be applied to this invention. Also, these materials can be used for improving thermal issues on vertical cavity surface emitting lasers (VCSELs) and other optoelectronic devices where thermal generation and low heat conduction is significant.

The highly thermally conductive dielectric in this invention serves two basic functions. First, it provides a lower index material than the semiconductor device so that certain kinds of optical waveguides may be formed, e.g., a ridge waveguide. The second and most important function, as it relates to this invention, is that it provides a significantly higher thermal conductivity than the semiconductor material, which is the principal material in the fabrication of various optoelectronic devices. One goal of the invention is to operate these devices without thermoelectric coolers. Normally, the optoelectronic devices need some kind of temperature control in order to operate properly in an optical communications system. The temperature control apparatus is usually cumbersome and adds significant complexity to the system.

An embodiment of the present invention comprises the use of a highly thermally conductive dielectric as the material used in one or both of the mirrors in the design of a vertical cavity semiconductor laser (1.3–1.6 $\mu$m wavelength of operation). In the case of long-wavelength vertical cavity laser diodes, heat generation is a significant detriment to the successful operation of the laser. By using a highly thermally conductive dielectric Bragg mirror, heat from the active region can be quickly conducted to the heat sink, and thus for a given operating current, the operating temperature of the device can be significantly reduced.

The uses of the invention include: 1) fiber optic communication devices: lasers, high intensity light emitting diodes, and optical amplifiers for telecommunications, networking, or data transport within a system area network; 2) high sensitivity detection of optical signals for field deployment, etc.; 3) DOD fly by fiber and avionics; and 4) any optoelectronics where thermal performance is a significant issue and thermoelectric (TE) coolers are not appropriate. The above devices have numerous military and commercial applications in communications, sensors, surveillance and storage.

DETAILED DESCRIPTION OF THE INVENTION

Figure 1:
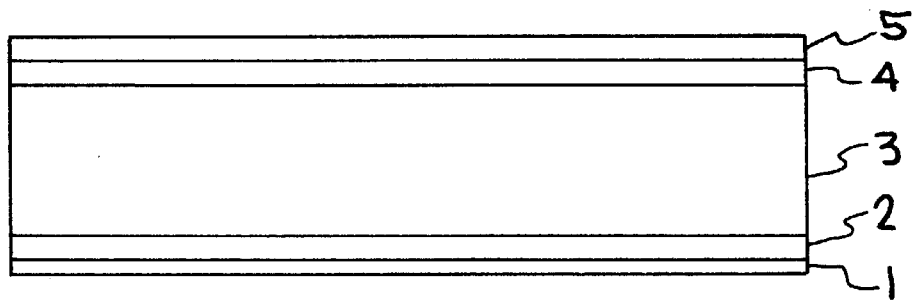
FIG. 1 shows the structure of an embodiment of the highly thermally conductive (HTC) layer of the present invention.

Referring to FIG. 1, there are essentially five layers in the HTC layer. The layer 1 is the adhesion layer. The thickness dimension of the adhesion layer is on the order of tens of angstroms. This material can be any number of reactive materials with oxygen. Its main purpose is to bind any III–V oxides with the subsequent layers. This material should be a semiconductor that is reactive with oxygen since a metal would tend to be very lossy for an optical signal. An example of material used in the adhesion layer is amorphous silicon. Other possible materials might be germanium.

For guided wave devices, layer 2 is a dielectric waveguide layer that provides optical confinement for the guided optical mode. This dielectric layer would represent the cladding of an optical waveguide. All of the core of the guide and possibly a portion of the upper cladding of the waveguide would reside in the semiconductor epitaxial layer below. One would try to optimize the thickness of layer 2 so as to reduce its thermal resistance while at the same time allowing for the optical mode intensity to decrease so that subsequent layers do not introduce excessive optical loss. This layer would be comprised of a low optical loss material such as SiO2, Al2O3, Ta2O5, etc.

Layer 3 is the thickest layer and is made of a highly heat conductive layer relative to the epitaxial material of a optoelectronic device to which the HTC layer is attached. This film can be comprised of any number of materials such as amorphous silicon, diamond, BeO, AlN or any other dielectic material that is electrically non-conductive but possesses high heat conductivity. This material is the most critical to the thermal performance since it is quite close to the active region and meant to be substantial in thickness relative to the other layers so that it conducts heat away from the active area. It is not necessary for this layer to be low optical loss, however it is preferred. The thickness of layer 2 will determine the amount of optical loss that can be tolerated in layer 3. In the case that layer 3 is made up of a Bragg reflector that is made of highly thermally conductive and low optical loss materials, then layer 2 may or may not be needed. A Bragg reflector is a series of high and low index layers that are each one-quarter wavelength thick (where the wavelength is the free space wavelength divided by the index of refraction). Bragg reflectors are typically made up 5 to 50 pairs of high and low index material.

Layer 4 is a stress compensation layer that is needed to compensate for the film built up in layers 1, 2, and 3. Layer 4 reduces any tendency of the film to delaminate due to differences in thermal expansion coefficients, i.e., it compensates for stress in the overall film stack. The net effect is that the process yields are significantly improved with this layer. In order to reduce stress and make a symmetric structure with regard to built in stress, this layer is made to be the same thickness as layer 2. However, other materials and thickness could be used. Again factors affecting the choice of thickness and material should be weighed against any increase in thermal resistance. Ideally, this layer would be made of a highly thermally conductive material that adhered well to layer 3 and any subsequent layers and the thickness would be chosen to reduce stress from the deposition of layers 2 and 3.

Layer 5 is provided in the case when resist or metal adhesion to the fourth layer is poor and so the fifth layer is usually made of the same material as the first layer. The fifth layer promotes adhesion and is provided for the ease of any subsequent processing steps. A material that can be used for layer 5 is amorphous silicon. The thickness of this layer is on the order of tens of angstroms.

One embodiment of the invention relates to an improvement in a ridge waveguide semiconductor optical amplifier (SOA). Other devices that can share this same basic ridge waveguide structure, except for the end facets, are laser diodes and an edge-emitting light emitting diode (LED). Semiconductor optical amplifiers are fiber optic devices that provide gain in optical networks. They can compensate for loss in the serial transmission of data such as a long haul fiber optic network or they can compensate for distribution loss such as the parallel transmission of cable TV signals. The SOA has been used extensively in switching systems and routers by overcoming loss from splitters as well as performing as the basic switch. The SOA has a very short carrier lifetime and thus can be switched in a nanosecond. Also, the SOA provides an extremely high extinction (on/off) ratio, up to 50 dB with reverse bias, that is a monotonic function of the applied voltage and thus ideally suited for switching applications.

Figure 2:
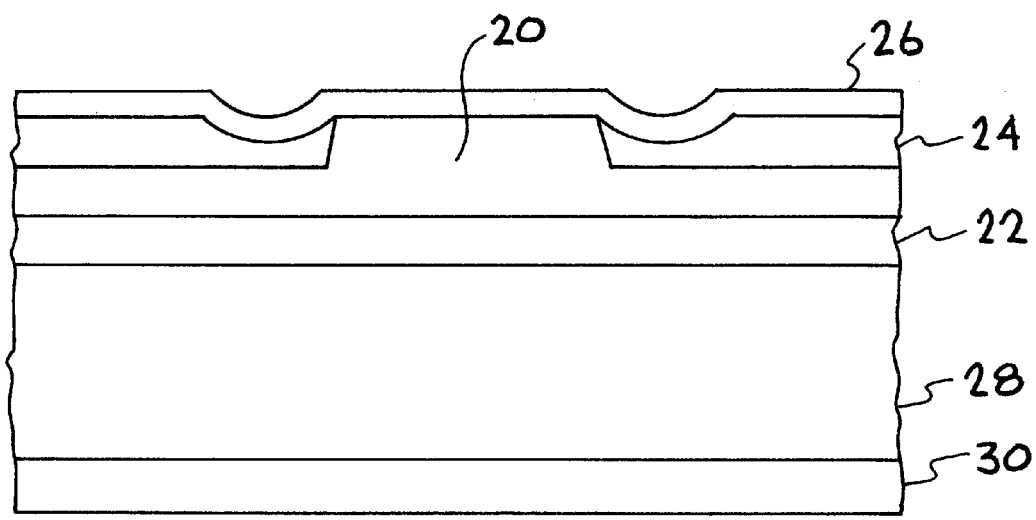
FIG. 2 shows a ridge waveguide utilizing an HTC layer.

A semiconductor optical amplifier utilizing the HTC layer and state of the art epitaxial materials is shown in FIG. 2. A ridge waveguide 20 is affixed to a thermally robust epitaxial material 22 (e.g., strained-layer InGaAs/AlInGaAs/InP quantum wells (QWs)). HTC dielectric layer 24 is affixed to the ridge waveguide 20. An electrically conductive layer 26 is applied to the top of the ridge waveguide 20 and the top portion of the HTC 24. The thermally robust layer 22 is attached to a semiconductor layer 28. Layer 28 is much thicker than layers 20, 22, 24, 26 and 30 since the major portion of it would be the semiconductor substrate, approximately 500 $\mu$m thick. Another electrically conductive layer 30 is applied to the bottom of epitaxial material 28. The other layers (20, 22, 24, 26 and 30) are no more than a few microns thick in total.

The latest advances in quantum confined technology (strained-layer InGaAs/AlInGaAs/InP QWs) and the HTC dielectric technology of the present invention are integrated, as shown in FIG. 2, to achieve a high gain thermally robust semiconductor optical amplifier (SOA) at 1.3 $\mu$m and 1.5 $\mu$m. Each technology significantly improves the thermal performance and thus, by combining the two, an unprecedented thermal performance for SOAs is achieved. This enables the operation of a high gain SOA without a thermoelectric cooler, which is presently the limitation in laser module lifetime.

The temperature dependence of quantum well devices arises in large part due to thermal excitation of electrons out of the quantum wells (QWs) and over the barrier regions. Since only electrons within QWs contribute to optical gain, such thermal excitations of the carriers out of the QWs degrades performance at high temperature. The InGaAs/AlInGaAs material system allows one to build QWs with a large activation energy barrier to thermal emission (i.e., a large "conduction band offset"), which significantly reduces device temperature dependence.

An additional advantage of these materials is their compatibility with strained layer epitaxy. By growing quantum wells which are strained (<2% lattice-mismatched), one can improve the optical gain characteristics. Strained layer epitaxy allows for the suppression of non-radiative recombination mechanisms such as Auger and intravalence band recombination processes which are significant at these wavelengths of interest. These non-radiative recombination mechanisms decrease the gain and are quite temperature sensitive in less thermally robust materials such as InGaAsP/InP which is the current material system for laser diodes used in the 1.3 to 1.6 $\mu$m wavelength range.

Under high current situations, the highly thermally conductive layer allows heat to be quickly dissipated near the active region of the SOA device. This technology has enabled high gain in a SOA using double heterostructure InGaAsP/InP material. The InGaAsP/InP double heterostructure is a thermally inferior material with respect to InGaAs/AlInGaAs/InP quantum wells in terms of the band offsets (380 meV versus 680 meV) and Auger recombination rates (worse by almost two orders of magnitude).

High performance lasers at 1.3 $\mu$m have been successfully demonstrated using the strained layer AlInGaAs QW. The quantity To is a parameter that describes the temperature sensitivity of a laser diode device.

In general the threshold gain varies in proportion to an exponential function of the temperature exp(T/To), where T is the temperature in degrees on the Kelvin scale. The exponential function represents a potentially very strong dependence on temperature when To is small: a doubling of To reduces any increases (as a ratio) in threshold due to temperature by the square root. By using AlInGaAs QWs, these lasers have demonstrated a doubling of To to 80 K versus an InGaAsP/InP multiple quantum well (MQW) with To~40 K. To is defined as Ith($\Delta$T)=Itho(exp($\Delta$T/To)). Ith is the threshold current needed to turn on the laser diode. The temperature difference, $\Delta$T, represents the temperature difference between the test temperature and, typically, the ambient temperature. Thus, a doubling of To reduces any increases (as a ratio) in threshold due to temperature by the square root. These lasers can operate without thermoelectric coolers and have excellent performance characteristics. Owing to the increased carrier level and the dependence of nonradiative recombination mechanisms (e.g., Auger and intravalence band absorption) on carrier and temperature, a high gain SOA is more difficult to make temperature insensitive than a laser diode. It is in this situation, that the real advantage of combining the InGaAs/AlInGaAs quantum well (QW) technology with the highly thermally conductive dielectric is apparent.

Multiple strained-layer quantum well technology can be used to fabricate a polarization independent SOA structure. By growing quantum wells which are strained (lattice-mismatched), one can preferentially select the optical polarization to be amplified. Changing the QW strain changes the amplified polarization state. By judiciously combining both tensile and compressively strained QWs, one can create amplifiers with polarization-insensitive gain characteristics. This attribute is essential for using components in conventional optical fiber systems, in which the optical polarization state varies in a random, time-dependent fashion. Lattice mismatch can give rise to compressive or tensile strain. Often in a semiconductor crystal lattice, the properties of the crystal are very dependent on the orientation of an applied field. In the case of tensile or compressive strain within the plane of the active layers of InGaAsP, AlInGaAs, or InGaAs the optical gain can be enhanced for the TE mode (applied compressive strain) or the TM mode (applied tensile strain). For example see M. A. Newkirk et al "1.5 $\mu$m Multiquantum-Well Semiconductor Optical Amplifier with Tensile and Compressively Strained Wells for Polarization-Independent Gain," IEEE Photonics Technology Letters, vol. 4, no. Apr. 4, 1993, pp. 406–408.

The laser diode and edge-emitting light emitting diode applications share the same ridge waveguide configuration as in FIG. 2. The only differences with a SOA are the end facets of the ridge waveguide. The laser diode would have a cleaved facet perpendicular to the waveguide; thus a cleaved facet mirror would be formed as in any conventional laser diode. The edge emitting light emitting diode would have one facet ( the one non-output facet) with significant optical loss to suppress lasing.

Another embodiment of the invention is the use of a specific high thermally conductive dielectric layer in a Bragg mirror for the purpose of reducing the operating temperature of a vertical cavity semiconductor laser diode. Heat generation leading to higher operating temperatures is an important problem to be solved in long wavelength (1.3–1.6 $\mu$m). In developing an appropriate mirror for a long wavelength vertical cavity, several important criteria need to be imposed. First, the mirror ideally would consist of highly thermally conductive dielectric materials while maintaining low optical loss. Second, the various mirror materials should posses large index differences so as to reduce the overall thickness of the mirror, which would reduce the overall thermal resistance. Third, the should have a very high reflectivity. Ideally, this reflectivity should be greater than 99.5%. The present invention is the first to combine the highly thermal conductivity material dielectric mirrors, that utilize AlN and hydrogenated amorphous Si, with the thermally robust AlGaInAs gain medium.

Figure 3A:
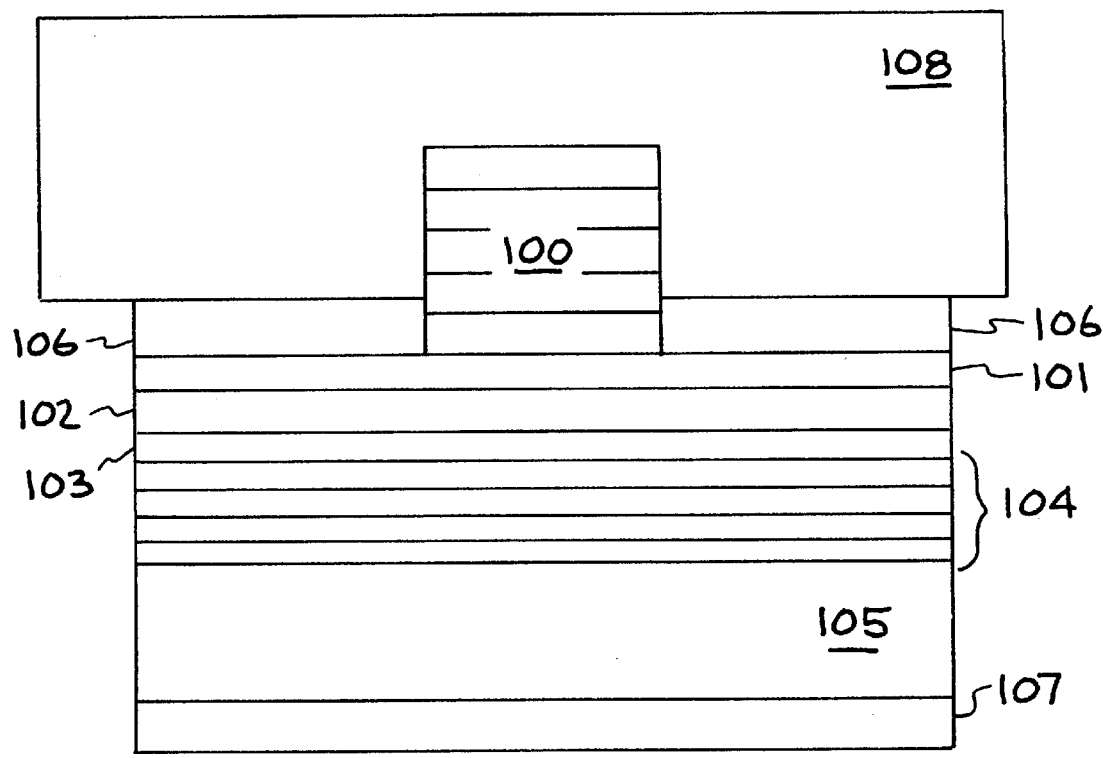
FIG. 3A shows the structure of the highly thermally conductive dielectric for a Bragg mirror in a vertical cavity laser.

FIG. 3A illustrates the structure of the Bragg mirror, 100, with the novel use of AlN (aluminum nitride) and hydrogenated amorphous Si as the pair of materials that comprise the Highly Thermally Conductive Bragg mirror layers. Bragg mirror 100 represents alternating pairs of materials, namely the AlN and the hydrogenated amorphous silicon, where the thickness of each layer is given by $\lambda/(4n)$ where $\lambda$ is the wavelength of operation of the laser and n is the optical index of refraction. The function of 100 is to reflect the optical laser light back towards the active region 102. Region 101 represents the p or n type semiconductor material such as InP or AlInGaAs. The function of 101 is to provide current carrier injection into region 102. Region 102 represents the active region that is made up of quantum wells of AlInGaAs or InGaAsP. The function of 102 is to provide optical gain to the laser light that propagates back and forth between Bragg mirrors 100 and 104. Region 103 represents the n or p type semiconductor material (opposite the type in 101). Region 103 provides current injection of the opposite carrier type to that of region 101; thus, by injecting carriers of opposite polarities into the active region 102, a population inversion is created in 102 and thus optical gain is provided.

Region 104 is the second Bragg mirror comprised of semiconductor material either InGaAsP/InP pairs or GaAs/AlGaAs pairs of materials. Region 105 is the semiconductor substrate from which the mirror 104 and regions 103,102, and 101 are grown. The substrate 105 can be either InP or GaAs. The ohmic contacts to provide electrical current to the device are provided by 106 and 107. Region 108 is a heat sink, comprising a large metal mount, preferably copper or a diamond submount, that conducts away the heat generated by the active region 102 and regions 101, 103, 104, 105, 106, and 107. The highly thermally conductive Bragg mirror 100 conducts the heat away from the active region where the laser light is present more efficiently than another type of Bragg mirror such as another semiconductor Bragg mirror.

Figure 3B:
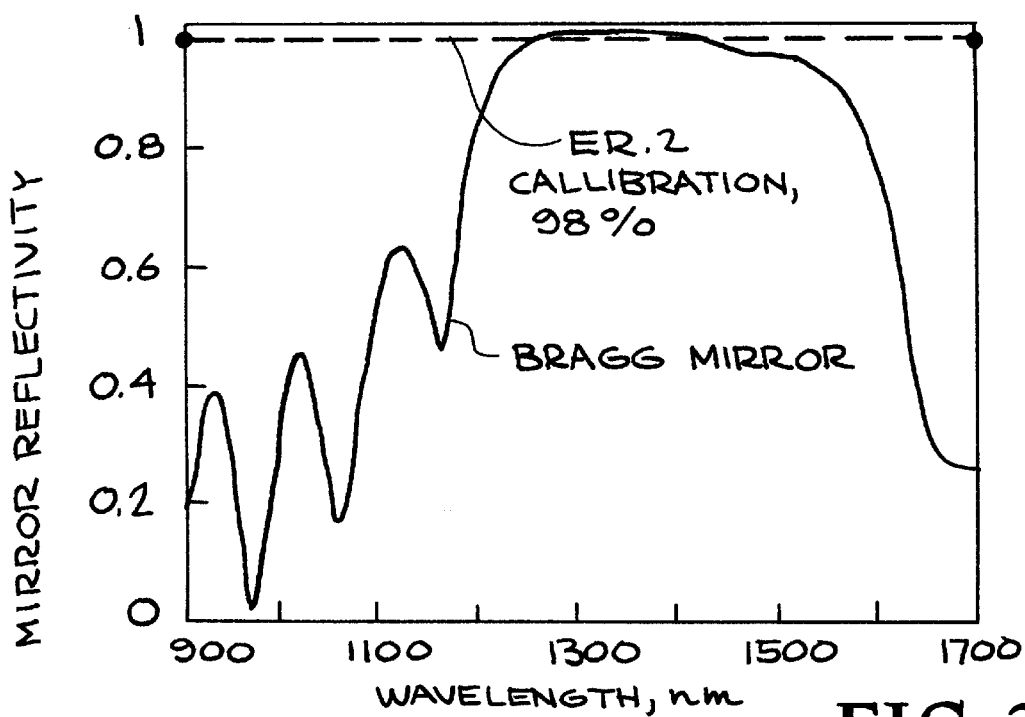
FIG. 3B shows the reflection spectrum of the Bragg mirror.

FIG. 3B shows the reflection spectrum of the Bragg mirror. The AlN was chosen for its high thermally conductivity and low optical loss. The hydrogenated amorphous silicon was chosen for its high optical index of refraction (~3.5) and low optical loss. The peak reflectivity at 1.3 $\mu$m is approximately greater than 99%. The number of dielectric pairs used in the mirror was 4 pairs of AlN and amorphous Si (the substrate was GaAs). The mirror used in the calibration of the reflectivity measurement was a Newport ER.2 mirror. The specified mirror reflectivity at 1.3 $\mu$m is 98% according to the Newport catalog. The measured reflectivity appears to be high enough to begin fabrication of a high quality thermally robust long wavelength vertical cavity semiconductor laser. Of course, as the device is further developed, the reflectivity will be improved and optimized (i.e. more mirror pairs will be added as needed) to achieve the necessary performance. The reflection measurement was performed by using a white light source coupled into a 50 $\mu$m core/125 $\mu$m cladding multi-mode fiber and then coupled into a 3 dB multi-mode directional coupler. One of the output ports was connected to a GRIN lens collimator. The light was retroreflected from the mirror under test and maximized for coupling. The other port on the 3 dB coupler was connected to the input of a Hewlett-Packard Optical Spectrum Analyzer. The calibration mirror was the Newport ER.2 mirror.

Changes and modifications in the specifically described embodiments can be carried out without departing from the scope of the invention, which is intended to be limited by the scope of the appended claims.

What is claimed is:

1. A high thermal conductivity (HTC) layer for use in an optoelectronic device, comprising:

an adhesion layer to bind any III–V oxides with materials of said optoelectronic device that are adjacent to said adhesion layer;

a dielectric waveguide layer that provides optical confinement for a guided optical mode, wherein said dielectric waveguide layer is fixedly connected to said adhesion layer;

a highly heat conductive layer relative to the material within the optical gain region of an optoelectronic device within which said HTC layer is used, wherein said highly heat conductive layer is fixedly connected to said dielectric waveguide layer; and a stress compensation layer to compensate for the film stress built up in said adhesion layer and said highly heat conductive layer, wherein said stress compensation layer is fixedly connected to said highly heat conductive layer, wherein said stress compensation layer reduces any tendency of said adhesion layer and said highly heat conductive layer to delaminate due to differences in thermal expansion coefficients.

2. The HTC layer of claim 1, wherein said HTC layer is located within 10 microns of said optical gain region of said optoelectronic device.

3. The HTC layer of claim 2, further comprising a second adhesion layer fixedly connected to said stress compensation layer for use when resist or metal adhesion to said stress compensation layer is poor.

4. The HTC layer of claim 2, wherein said adhesion layer has a thickness on the order of tens of angstroms.

5. The HTC layer of claim 2, wherein said adhesion layer comprises metals that are reactive with oxygen.

6. The HTC layer of claim 2, wherein said adhesion layer comprises amorphous silicon.

7. The HTC layer of claim 2, wherein said adhesion layer comprises germanium.

8. The HTC layer of claim 1, wherein said dielectric waveguide layer comprises a thickness that is optimized to reduce its thermal resistance while allowing for the optical mode intensity within said optoelectronic device to decrease excessive optical loss is not introduced by said HTC layer.

9. The HTC layer of claim 1, wherein said dielectric waveguide layer comprises a low optical loss material.

10. The HTC layer of claim 1, wherein said dielectric waveguide layer comprises SiO2.

11. The HTC layer of claim 1, wherein said dielectric waveguide layer comprises Al2O3.

12. The HTC layer of claim 1, wherein said dielectric waveguide layer comprises Ta2O5.

13. The HTC layer of claim 2, wherein said highly heat conductive layer is the thickest layer of said HTC layer.

14. The HTC layer of claim 2, wherein said highly heat conductive layer comprises amorphous silicon.

15. The HTC layer of claim 2, wherein said highly heat conductive layer comprises diamond.

16. The HTC layer of claim 2, wherein said highly heat conductive layer comprises BeO.

17. The HTC layer of claim 2, wherein said highly heat conductive layer comprises AlN.

18. The HTC layer of claim 2, wherein said highly heat conductive layer comprises any dielectic material that is electrically non-conductive but possesses high heat conductivity.

19. The HTC layer of claim 2, wherein said highly heat conductive layer comprises a Bragg reflector.

20. The HTC layer of claim 2, wherein said stress compensation layer comprises a highly thermally conductive material.

21. The HTC layer of claim 3, wherein said second adhesion layer comprises amorphous silicon.

22. The HTC layer of claim 3, wherein said second adhesion layer comprises a thickness that is on the order of tens of angstroms.

23. The HTC layer of claim 1, wherein said wave guide device comprises a cladding layer, wherein said cladding layer comprises said HTC layer.

24. The HTC layer of claim 1, wherein said wave guide device comprises a cladding layer, wherein said HTC layer forms the cladding layer or part of the cladding layer.

25. The HTC layer of claim 23, wherein said wave guide device comprises an active gain region comprising quantum well material.

26. The HTC layer of claim 23, wherein said highly heat conductive layer comprises Aluminum Nitride.

27. The HTC layer of claim 23, wherein said highly heat conductive layer comprises Silicon.

28. The HTC layer of claim 23, wherein said highly heat conductive layer comprises diamond-like carbon.

29. The HTC layer of claim 23, wherein said highly heat conductive layer comprises beryllium oxide.

30. The HTC layer of claim 23, wherein said highly heat conductive layer comprises a material selected from a group consisting of Aluminum Nitride, Silicon, diamond-like carbon and beryllium oxide, wherein said material comprises a structure selected from a group consisting of an amorphous structure and a polycrystalline structure.

31. The HTC layer of claim 25, wherein said quantum well comprises AlGaInAs.

32. A laser, comprising:

an optically active region;

a highly thermally conductive Bragg mirror to reflect laser light generated within said optically active region back towards said optically active region;

a first region fixedly attached between said optically active region and said Bragg mirror wherein said first region provides current carrier injection into said optically active region;

a second region that provides current injection of the opposite carrier type to that of said first region, wherein said second region is fixedly attached to said optically active region on a side opposite to the side of said optically active region that said first region is fixedly attached, wherein by injecting carriers of opposite polarities into said optically active region, a population inversion is created therein and optical gain is provided;

a second Bragg mirror to reflect laser light generated within said optically active region back towards said optically active region;

a semiconductor substrate fixedly connected to said second Bragg mirror;

a first ohmic contact connected to the wall of said highly thermally conductive Bragg mirror and to said first region;

a second ohmic contact connected to said semiconductor substrate, wherein a source of electrical current may be connected to said first ohmic contact and said second ohmic contact to provide electrical current to said laser; and a heat sink connected to said highly thermally conductive Bragg mirror and to said first ohmic contact.

33. The laser of claim 32, wherein said optically active region comprises quantum wells.

34. The laser of claim 33, wherein said quantum wells comprise material selected from a group consisting of AlInGaAs and InGaAsP.

35. The laser of claim 32, wherein said highly thermally conductive Bragg mirror comprises alternating layers of aluminum nitride and hydrogenated amorphous Silicon.

36. The laser of claim 35, wherein the thickness of each layer of said alternating layers is given by $\lambda/(4\ n)$ where $\lambda$ is the wavelength of operation of said laser and n is the optical index of refraction of said layer.

37. The laser of claim 32, wherein said first region comprises material selected from a group consisting of p type semiconductor material and n type semiconductor material.

38. The laser of claim 32, wherein said first region comprises material selected from a group consisting of InP and AlInGaAs.

39. The laser of claim 32, wherein said second region comprises a material selected from a group consisting of n type semiconductor material and p type semiconductor material, wherein the selection of the type of semiconductor material of said second region is opposite the type of semiconductor material of said first region.

40. The laser of claim 32, wherein said a second Bragg mirror comprises pairs of semiconductor material selected from a group consisting of InGaAsP/InP and GaAs/AlGaAs.

41. The laser of claim 32, wherein said semiconductor substrate is selected from a group consisting of InP and GaAs.

42. The laser of claim 32, wherein said heat sink comprises a metal mount comprising copper with a diamond submount.

43. The laser of claim 42, wherein said metal mount comprises copper with a diamond submount.

44. A high thermal conductivity (HTC) layer for use in an optoelectronic device, comprising:

an adhesion layer to bind any III–V oxides with materials of said optoelectronic device that are adjacent to said adhesion layer;

a highly heat conductive layer relative to the material within the optical gain region of an optoelectronic device within which said HTC layer is used, wherein said highly heat conductive layer is fixedly attached to said adhesion layer; and a stress compensation layer to compensate for the film stress built up in said adhesion layer and said highly heat conductive layer, wherein said stress compensation layer is fixedly attached to said highly heat conductive layer, wherein said stress compensation layer reduces any tendency of said adhesion layer and said highly heat conductive layer to delaminate due to differences in thermal expansion coefficients.

* * * * *